United States Patent
Jee (10) Patent No.: US 11,847,325 B2
(45) Date of Patent: Dec. 19, 2023

(54) SEMICONDUCTOR INTEGRATED APPARATUS, OPERATING METHOD THEREOF AND DATA PROCESSING APPARATUS INCLUDING THE SAME

(71) Applicant: SK hynix Inc., Gyeonggi-do (KR)

(72) Inventor: Dae Geun Jee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 112 days.

(21) Appl. No.: 17/495,552

(22) Filed: Oct. 6, 2021

(65) Prior Publication Data
US 2022/0283715 A1  Sep. 8, 2022

(30) Foreign Application Priority Data
Mar. 4, 2021  (KR) .......... 10-2021-0028778

(51) Int. Cl.
*G06F 3/06* (2006.01)
*G11C 17/16* (2006.01)
*G11C 17/18* (2006.01)

(52) U.S. Cl.
CPC .......... *G06F 3/0625* (2013.01); *G06F 3/0655* (2013.01); *G06F 3/0679* (2013.01); *G11C 17/16* (2013.01); *G11C 17/18* (2013.01)

(58) Field of Classification Search
CPC ........ G06F 1/26; G06F 3/0625; G06F 3/0655; G06F 3/0679; G11C 17/16; G11C 17/18
USPC .................................................. 711/154, 103
See application file for complete search history.

(56) References Cited

U.S. PATENT DOCUMENTS

| | | | | |
|---|---|---|---|---|
| 2004/0207025 A1* | 10/2004 | Chiba | ............... | G11C 16/0425 257/390 |
| 2009/0154237 A1* | 6/2009 | Tokiwa | ............... | G11C 16/20 365/185.11 |
| 2015/0318842 A1* | 11/2015 | Thakur | ............... | G11C 16/14 327/143 |
| 2020/0279611 A1* | 9/2020 | Reusswig | ............... | G11C 7/20 |
| 2021/0149564 A1* | 5/2021 | Luo | ............... | G06F 3/0616 |

FOREIGN PATENT DOCUMENTS

| KR | 100885489 B1 | 2/2009 |
|---|---|---|
| KR | 1020130072712 A | 7/2013 |

* cited by examiner

*Primary Examiner* — Hashem Farrokh
(74) *Attorney, Agent, or Firm* — IP & T GROUP LLP (57) ABSTRACT

A semiconductor integrated apparatus includes a plurality of functional blocks configured by electronic devices; and a processor configured to control the plurality of functional blocks, select voltage trim values of the respective functional blocks based on a level of input power supplied during a power-on operation, and provide the voltage trim values to the plurality of functional blocks, respectively.

19 Claims, 6 Drawing Sheets

SEMICONDUCTOR INTEGRATED APPARATUS, OPERATING METHOD THEREOF AND DATA PROCESSING APPARATUS INCLUDING THE SAME

CROSS-REFERENCES TO RELATED APPLICATION

The present application claims priority under 35 U.S.C, § 119(a) to Korean application number 10-2021-0028778, filed on Mar. 4, 2021, which is incorporated herein by reference in its entirety.

BACKGROUND

1. Technical Field

Various embodiments of the present disclosure generally relate to a semiconductor apparatus, and more particularly, to a semiconductor integrated apparatus, an operating method thereof and a data processing apparatus including the same.

2. Related Art

A SoC (system on chip) is a technology-intensive semiconductor technology in which a plurality of electronic devices with various functions are implemented as one chip, and is mainly applied to an embedded system.

The SoC may be configured by a processor which controls an entire system and various functional blocks which are controlled by the processor. A functional block may be referred to as a circuit, a logic or the like which may be integrated into the SoC, or a combination of functional blocks.

SUMMARY

In an embodiment of the present disclosure, a semiconductor integrated apparatus may include: a plurality of functional blocks configured by electronic devices; and a processor configured to control the plurality of functional blocks, select voltage trim values of the respective functional blocks based on a level of input power supplied during a power-on operation, and provide the voltage trim values to the plurality of functional blocks, respectively.

In an embodiment of the present disclosure, a method for operating a semiconductor integrated apparatus, including a plurality of functional blocks which are configured by electronic devices and a processor which controls the plurality of functional blocks, may include: determining, by the processor, an input power level during a power-on operation of the semiconductor integrated apparatus; selecting, by the processor, voltage trim values of the respective functional blocks corresponding to the input power level; and providing, by the processor, the selected voltage trim values to the plurality of functional blocks, respectively.

In an embodiment of the present disclosure, a data processing apparatus may include: a storage configured to store data; and a controller configured to transmit and receive data by controlling the storage in response to a request of a host apparatus, the controller including: a plurality of functional blocks configured by electronic devices; and a processor configured to control the plurality of functional blocks, select voltage trim values of the respective functional blocks based on a level of input power supplied during a power-on operation, and provide the selected voltage trim values to the plurality of functional blocks, respectively.

DETAILED DESCRIPTION

Hereinafter, a semiconductor integrated apparatus, an operating method thereof and a data processing apparatus including the same Will be described below with reference to the accompanying drawings through various examples of embodiments of the present disclosure.

Figure 1:
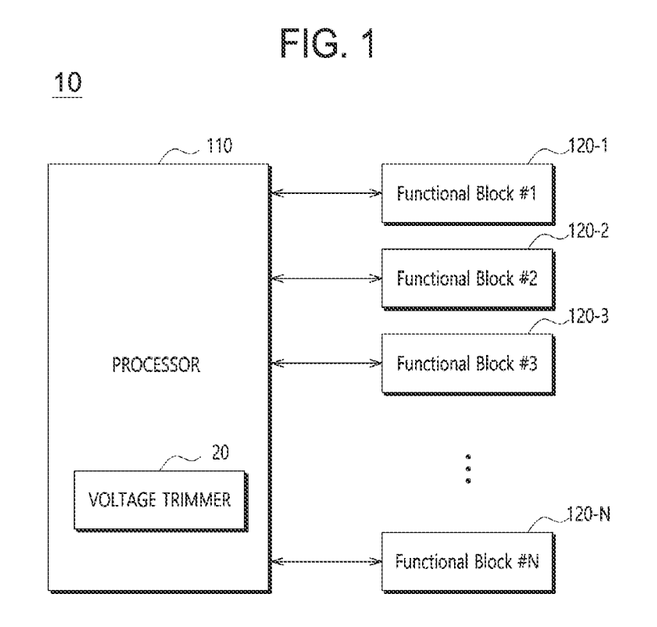
FIG. 1 is a configuration diagram of a semiconductor integrated apparatus in accordance with an embodiment of the present disclosure.

FIG. 1 is a configuration diagram of a semiconductor integrated apparatus in accordance with an embodiment of the present disclosure.

Referring to FIG. 1, a semiconductor integrated apparatus 10 in accordance with an embodiment may include a processor 110 and a plurality of functional blocks 120-1 to 120-N which operate under the control of the processor 110. The semiconductor integrated apparatus 10 may be, for example, an SoC (system on chip) in which the plurality of functional blocks 120-1 to 120-N with various functions are implemented as one chip. In order for the semiconductor integrated apparatus 10 to be applied to an embedded system, at least one of the plurality of functional blocks 120-1 to 120-N may be an interface functional block capable of communicating with a host apparatus or a slave apparatus.

Functional blocks 120-1 to 120-N which are integrated into one SoC have different operating characteristics such as operating frequencies and voltages. Even in the same functional block, operating characteristics may vary depending on input power, and thus, it is necessary to trim an operating voltage according to the input power.

In an embodiment, each of the plurality of functional blocks 120-1 to 120-N may be an electronic system selected among functional blocks such as a CPU (central processing unit), a GPU (graphics processing unit), an NPU (neural network processor), a CP (communication processor), each core of a mufti-core processor, a PMU (power management unit), a CMU (dock management unit), a system BUS, a memory, a USB (universal serial bus), a PCI (peripheral component interconnect), a DSP (digital signal processor), a wired interface, a wireless interface, a controller, an embedded software, a codec, a video module, a graphics core, an audio system, a volatile memory, a nonvolatile memory and a memory controller.

In an embodiment, the processor 110 may include a voltage trimmer 20.

The operating characteristics of each of the functional blocks 120-1 to 120-N may vary depending on input power of an apparatus to which the semiconductor integrated apparatus 10 is mounted, that is, a host apparatus. For example, an operating voltage characteristic in a first host apparatus operating with a first power supply and an operating voltage characteristic in a second host apparatus operating with a second power supply may be different from each other.

Therefore, operating voltage characteristics of the respective functional blocks 120-1 to 120-N depending on an input power level of the host apparatus are measured through a wafer level test, and candidate trim values for trimming the operating voltage characteristics are determined and are stored in a storage space in the voltage trimmer 20. Input power information may be obtained when the semiconductor integrated apparatus 10 is powered on, and trim values for the respective functional blocks 120-1 to 120-N may be selected from the candidate trim values corresponding to the input power information. The selected trim values may be transferred to the functional blocks 120-1 to 120-N, respectively.

That is, the voltage trimmer 20 may be configured to store candidate voltage trim values of each of the functional blocks 120-1 to 120-N, the candidate voltage trim values being classified according to an input power level. Further, the voltage trimmer 20 may be configured to select voltage trim values for the respective functional blocks 120-1 to 120-N according to the input power information from the candidate voltage trim values and provide selected voltage trim values to the respective functional blocks 120-1 to 120-N. The respective functional blocks 120-1 to 120-N may trim respective operating parameters such as voltage characteristic information according to the provided voltage trim values.

Figure 2:
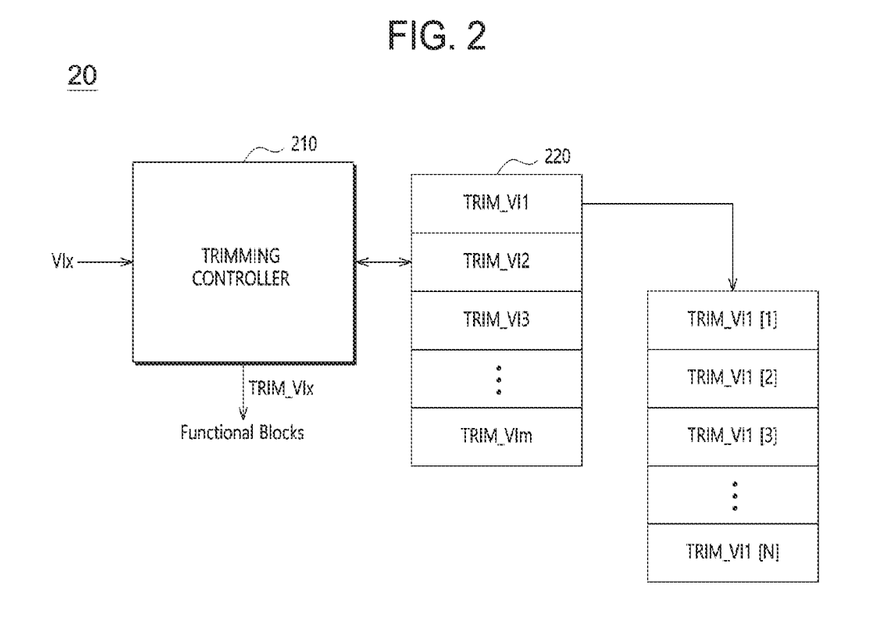
FIG. 2 is a configuration diagram of a voltage trimmer in accordance with an embodiment of the present disclosure.

FIG. 2 is a configuration diagram of a voltage trimmer in accordance with an embodiment of the present disclosure.

Referring to FIG. 2, the voltage trimmer 20 may include a trimming controller 210 and a trim value memory circuit 220.

The trimming controller 210 may obtain input power information VI during a power-on operation of the semiconductor integrated apparatus 10.

The trim value memory circuit 220 may store candidate voltage trim values TRIM_VI1, TRIM_VI2, TRIM_VI3, . . . and TRIM_VIm classified according to input power information VIx, where x is an integer equal to or greater than 1 and equal to or less than m. Each of the candidate voltage trim values TRIM_VI1, TRIM_VI2, TRIM_VI3, . . . and TRIM_VIm may have plural values TRIM_VIx[1] to TRIM_VIx[N] for the respective functional blocks 120-1 to 120-N.

In an embodiment, the trim value memory circuit 220 may include e-fuses and be programmed according to trim values, but is not limited thereto.

Therefore, when the semiconductor integrated apparatus 10 is adopted for a host apparatus operating with first input power VI1, trim values TRIM_VI1[1] to TRIM_VI1[N] for the first input power VI1, may be selected from the candidate voltage trim values TRIM_VI1, TRIM_VI2, TRIM_VI3, . . . and TRIM_VIm and provided to the respective functional blocks 120-1 to 120-N. When the semiconductor integrated apparatus 10 is adopted for a host apparatus operating with mth input power Vim, trim values TRIM_VIm[1] to TRIM_VIm[N] for the mth input power Vim may be selected from the candidate voltage trim values TRIM_VI1, TRIM_VI2, TRIM_VI3, . . . and TRIM_VIm and provided to the respective functional blocks 120-1 to 120-N.

In the case where voltage trim values of the functional blocks 120-1 to 120-N included in the semiconductor integrated apparatus 10 are fixed, the semiconductor integrated apparatus 10 should be manufactured for each input power of a host apparatus for which the semiconductor integrated apparatus 10 is adopted, which involves complicated manufacturing.

According to the present technology, candidate voltage trim values for each of the functional blocks 120-1 to 120-N, the candidate voltage trim values being classified according to an input power level, may be stored and voltage trim values corresponding to input power information may be selected from the candidate voltage trim values.

Accordingly, operating parameters of functional blocks may be trimmed to be adapted to a voltage level supplied from a host apparatus, and compatibility with host apparatuses having different input power levels may be improved.

Figure 3:
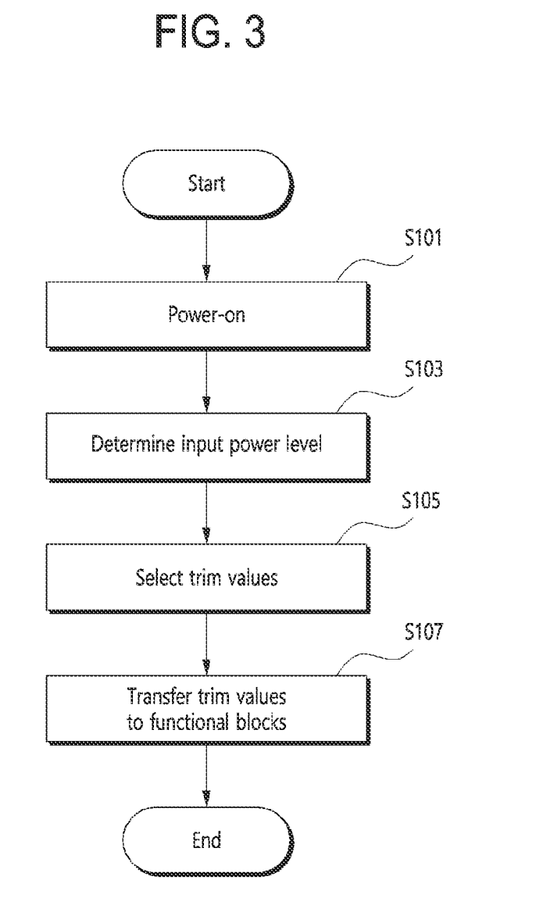
FIG. 3 is a flowchart illustrating a method for operating a semiconductor integrated apparatus in accordance with an embodiment of the present disclosure.

FIG. 3 is a flowchart illustrating a method for operating a semiconductor integrated apparatus in accordance with an embodiment of the present disclosure.

As the semiconductor integrated apparatus 10 illustrated in FIGS. 1 and 2 is mounted to the host apparatus and is powered on (S101), the trimming controller 210 may receive the input power information VI from the host apparatus and detect a level of input power (S103).

The trimming controller 210 may select trim values from the trim value memory circuit 220 based on a result of detecting the input power level (S105), The trimming controller 210 may transmit the selected trim values to the respective functional blocks 120-1 to 120-N (S107), and accordingly, the functional blocks 120-1 to 120-N may trim operating parameters such as voltage characteristics thereof.

Figure 4:
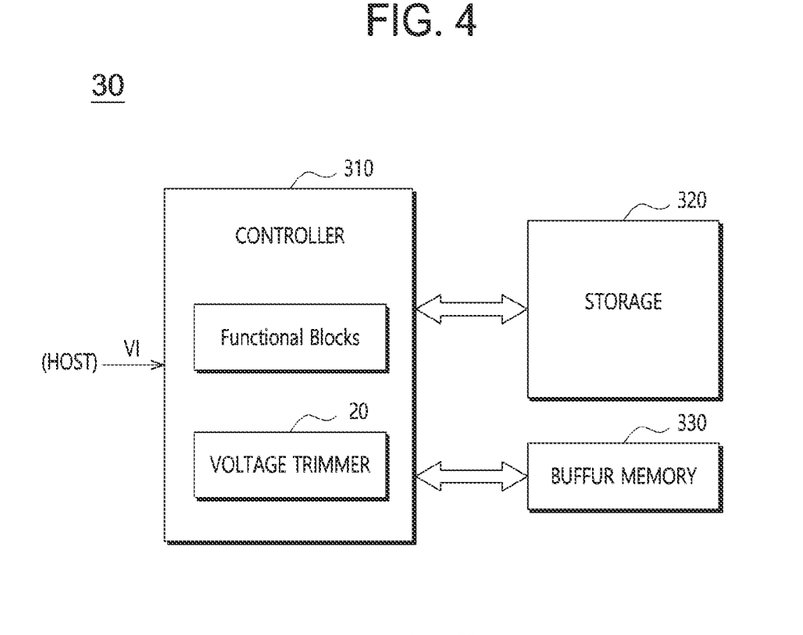
FIG. 4 is a configuration diagram of a data processing apparatus in accordance with an embodiment of the present disclosure.

FIG. 4 is a configuration diagram of a data processing apparatus in accordance with an embodiment of the present disclosure.

Referring to FIG. 4, a data processing apparatus 30 in accordance with an embodiment may include a controller 310, a storage 320 and a buffer memory 330.

The controller 310 may include the voltage trimmer 20 illustrated in FIGS. 1 and 2.

The controller 310 may be configured to obtain input voltage information VI from a host apparatus (not illustrated) during a power-to on operation and obtain trim values of respective functional blocks corresponding to the input voltage information VI.

The controller 310 may control the storage 320 in response to a request of the host apparatus. For example, the controller 310 may cause data to be programmed to the storage 320, according to a write request of the host apparatus. The controller 310 may provide data recorded in the storage 320 to the host apparatus, in response to a read request of the host apparatus.

The storage 320 may program data or output programmed data under the control of the controller 310. The storage 320 may be configured by a volatile or nonvolatile memory apparatus. In an embodiment, the storage 320 may be implemented using a memory device selected among various nonvolatile memory devices such as an EEPROM (electrically erasable and programmable ROM), a NAND flash memory, a NOR flash memory, a PRAM (phasechange RAM), a ReRAM (resistive RAM), an FRAM (ferroelectric RAM) and an STT-MRAM (spin-torque transfer magnetic RAM).

The storage 320 may include a plurality of nonvolatile memory apparatuses, and each nonvolatile memory apparatus may include a plurality of dies, a plurality of chips or a plurality of packages. The storage 320 may be configured by single level cells (SLC) each storing data of one bit or extra-level cells (XLC) each storing data of a plurality of bits.

The buffer memory 330 serves as a space capable of temporarily storing data transmitted and received when the data processing apparatus 30 performs a series of operations such as writing or reading data in cooperation with the host apparatus. While FIG. 4 illustrates as an example a case where the buffer memory 330 is located outside the controller 310, the buffer memory 330 may be disposed inside the controller 310.

In order for the controller 310 to process a request of the host apparatus when transmitting and receiving data to and from the storage 320 and the buffer memory 330, the controller 310 may be an SoC in which a plurality of functional blocks including a host interface, a storage interface and a buffer memory interface and a processor for controlling the plurality of functional blocks are implemented as one chip.

Figure 5:
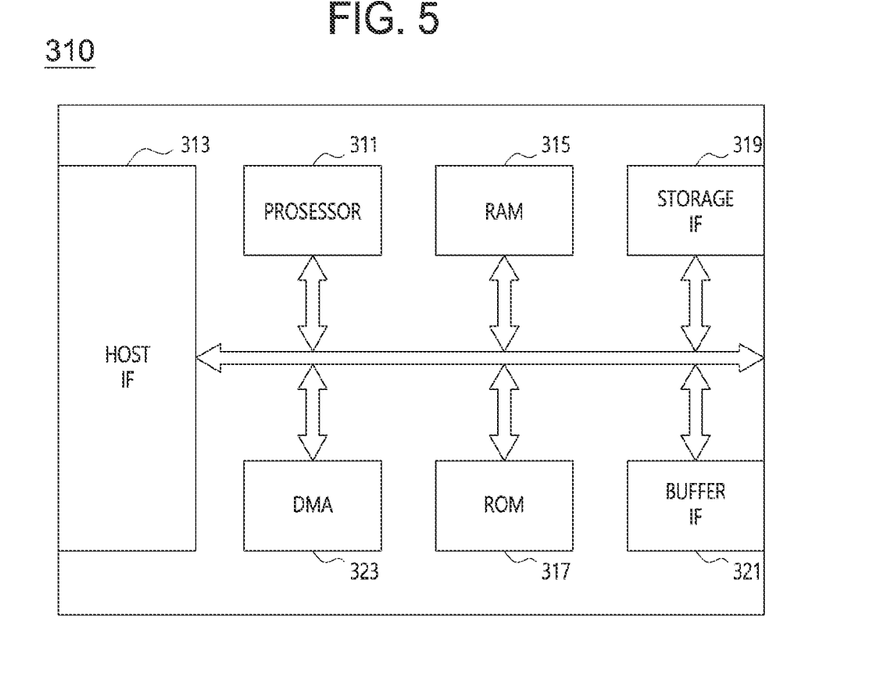
FIG. 5 is a configuration diagram of a controller in accordance with an embodiment of the present disclosure.

FIG. 5 is a configuration diagram of a controller in accordance with an embodiment of the present disclosure.

Referring to FIG. 5, a controller 310 in accordance with an embodiment may include a processor 311, a host interface 313, a RAM 315, a ROM 317, a storage interface 319, a buffer interface 321 and a direct memory access circuit (DMA) 323.

The processor 311 may be configured to transfer various control information required for a data read or write operation for the storage 320, to the host interface 313, the RAM 315, the buffer interface 321 and the storage interface 319. In an embodiment, the processor 311 may operate according to a firmware provided for various operations of the data processing apparatus 30. In an embodiment, the processor 311 may perform the function of a flash translation layer (FTL) such as garbage collection, address mapping and wear leveling for managing the storage 320, and a function of detecting and correcting an error of data read from the storage 320.

The host interface 313 may provide a communication channel for receiving a command and a dock signal from the host apparatus and controlling input/output of data, under the control of the processor 311. In particular, the host interface 313 may provide a physical coupling between the host apparatus and the data processing apparatus 30. Further, the host interface 113 may provide interfacing with the data processing apparatus 30 in correspondence to a bus format of the host apparatus. The bus format of the host apparatus may include at least one among standard communication interfaces or protocols such as secure digital, universal serial bus (USB), multimedia card (MMC), embedded MMC (eMMC), personal computer memory card international association (PCMCIA), parallel advanced technology attachment (DATA), serial advanced technology attachment (SATA), small computer system interface (SCSI), serial attached SCSI (SAS), peripheral component interconnection (PCI), PCI express (PCI-e or PCIe) and universal flash storage (UFS).

The RAM 315 may store data required for the operation of the controller 310 or data generated by the controller 310.

The ROM 317 may store a program code required for the operation of the controller 310, for example, a firmware or a software, and may store code data used by program codes.

The storage interface 319 may provide a communication channel for signal transmission and reception between the controller 310 and the storage 320. The storage interface 319 may write data, temporarily stored in the buffer memory 330, to the storage 320 under the control of the processor 311. Moreover, the storage interface 319 may transfer and temporarily store data, read from the storage 320, to and in the buffer memory 330.

The buffer interface 321 may be configured to provide a communication channel for signal transmission and reception between the buffer memory 330 and the controller 310 and to control the buffer memory 330.

Operating voltage characteristics of the various functional blocks such as the host interface 313, the RAM 315, the ROM 317, the storage interface 319, the buffer interface 321 and the direct memory access circuit (DMA) 323 may vary depending on an input power level.

The controller 310 according to the present technology may include the voltage trimmer 20, may select trim values for respective functional blocks corresponding to input power information, and may transfer the trim values to the respective functional blocks including the host interface 313, the RAM 315, the ROM 317, the storage interface 319, the buffer interface 321 and the direct memory access circuit (DMA) 323.

Figure 6:
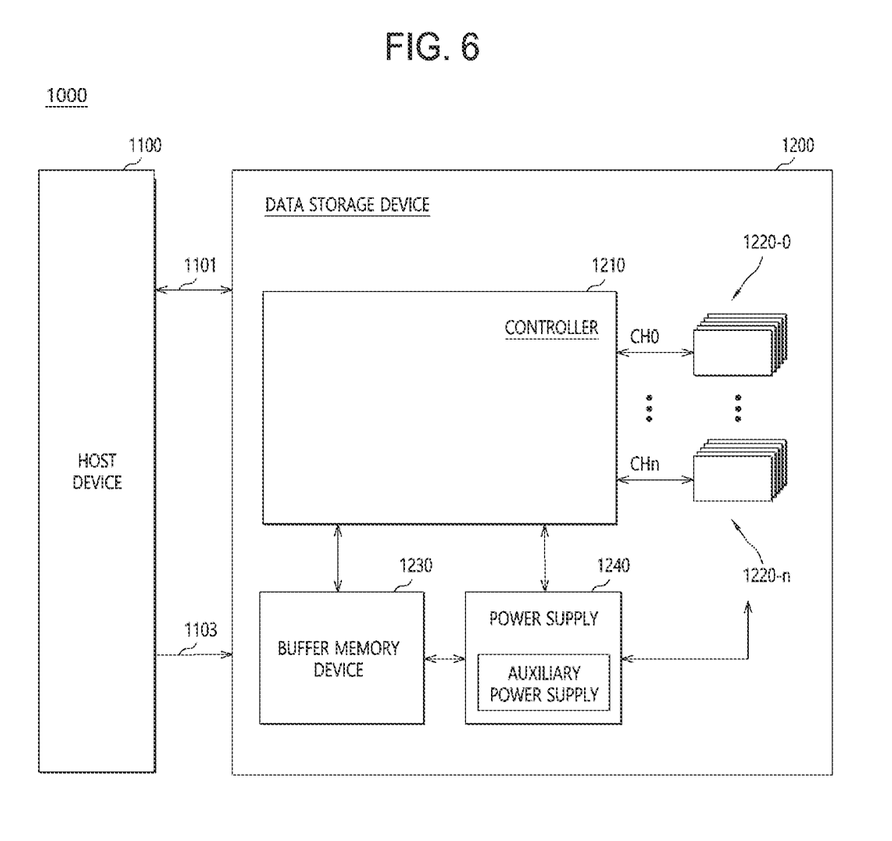
FIG. 6 is a diagram illustrating a data storage system in accordance with an embodiment of the present disclosure.

FIG. 6 is a diagram illustrating a data storage system 1000, in accordance with an embodiment of the present disclosure.

Referring to FIG. 6, the data storage system 1000 may include a host device 1100 and the data storage device 1200, In an embodiment, the data storage device 1200 may be configured as a solid state drive (SSD).

The data storage device 1200 may include a controller 1210, a plurality of nonvolatile memory devices 1220-0 to 1220-n, a buffer memory device 1230, a power supply 1240, a signal connector 1101, and a power connector 1103.

The controller 1210 may control general operations of the data storage device 1200. The controller 1210 may include a host interface, a processor, a random access memory used as a working memory, an error correction code (ECC) circuit, and a memory interface. In an embodiment, the controller 1210 may be configured as a SoC such like the semiconductor integrated apparatus 10 shown in FIGS. 1 and 2.

The host device 1100 may exchange a signal with the data storage device 1200 through the signal connector 1101. The signal may include a command, an address, data, and so forth.

The controller 1210 may analyze and process the signal received from the host device 1100. The controller 1210 may control operations of internal function blocks according to firmware or software for driving the data storage device 1200.

The buffer memory device 1230 may temporarily store data to be stored in at least one of the nonvolatile memory devices 1220-0 to 1220-n. Further, the buffer memory device 1230 may temporarily store the data read from at least one of the nonvolatile memory devices 1220-0 to 1220-n. The data temporarily stored in the buffer memory to device 1230 may be transmitted to the host device 1100 or at least one of the nonvolatile memory devices 1220-0 to 1220-n according to control of the controller 1210.

The nonvolatile memory devices 1220-0 to 1220-n may be used as storage media of the data storage device 1200.

The nonvolatile memory devices 1220-0 to 1220-n may be coupled with the controller 1210 through a plurality of channels CH0 to CHn, respectively. One or more nonvolatile memory devices may be coupled to one channel. The nonvolatile memory devices coupled to each channel may be coupled to the same signal bus and data bus.

The power supply 1240 may provide power inputted through the power connector 1103 to the controller 1210, the nonvolatile memory devices 1220-0 to 1220-n and the buffer memory device 1230 of the data storage device 1200. The power supply 1240 may include an auxiliary power supply. The auxiliary power supply may supply power to allow the data storage device 1200 to be normally terminated when a sudden power interruption occurs. The auxiliary power supply may include bulk-capacity capacitors sufficient to store the needed charge.

The signal connector 1101 may be configured as one or more of various types of connectors depending on an interface scheme between the host device 1100 and the data storage device 1200.

The power connector 1103 may be configured as one or more of various types of connectors depending on a power supply scheme of the host device 1100.

Figure 7:
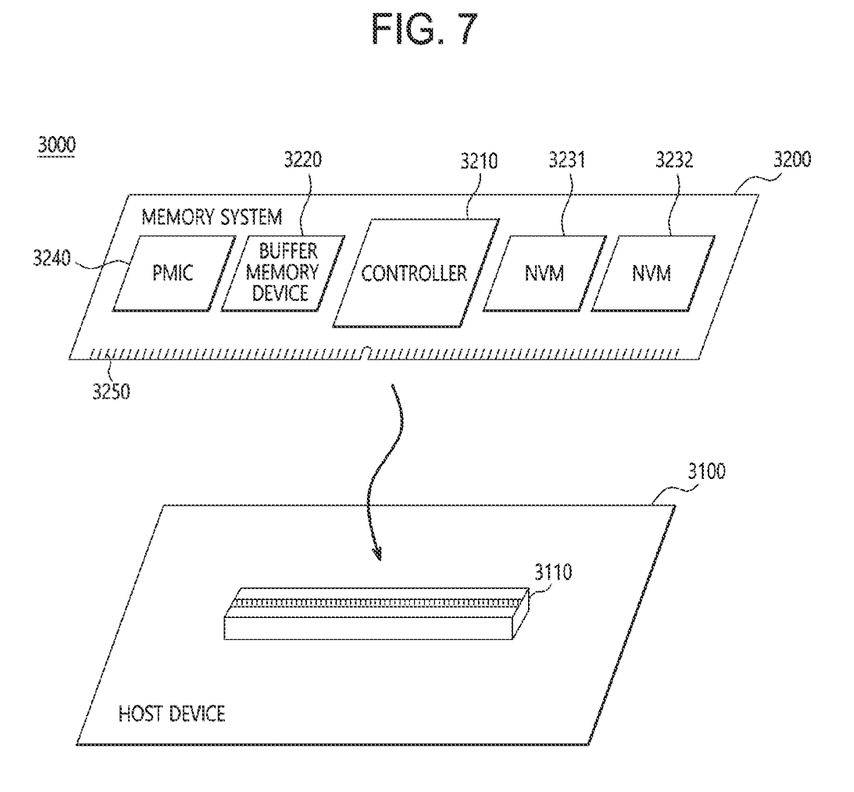
FIG. 7 and FIG. 8 are diagrams illustrating a data processing system in accordance with an embodiment of the present disclosure.

FIG. 7 is a diagram illustrating a data processing system 3000, in accordance with an embodiment of the present disclosure. Referring to FIG. 7, the data processing system 3000 may include a host device 3100 and a memory system 3200.

The host device 3100 may be configured in the form of a board, such as a printed circuit board. Although not shown, the host device 3100 may include internal function blocks for performing the function of a host device.

The host device 3100 may include a connection terminal 3110, such as a socket, a slot, or a connector. The memory system 3200 may be mated to the connection terminal 3110.

The memory system 3200 may be configured in the form of a board, such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC)3240, and a connection terminal 3250.

The controller 3210 may control general operations of the memory system 3200. The controller 3210 may be configured in the same manner as a SoC such like the semiconductor integrated apparatus 10 shown in FIGS. 1 and 2.

The buffer memory device 3220 may temporarily store data to be stored in the nonvolatile memory devices 3231 and 3232. Further, the buffer memory device 3220 may temporarily store data read from the nonvolatile memory devices 3231 and 3232, The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power inputted through the connection terminal 3250 to the inside of the memory system 3200. The PMIC 3240 may manage the power of the memory system 3200 according to control of the controller 3210.

The connection terminal 3250 may be coupled to the connection terminal 3110 of the host device 3100. Through the connection terminal 3250, signals such as commands, addresses, data, and so forth, and power may be transferred between the host device 3100 and the memory system 3200.

The connection terminal 3250 may be configured as one or more of various types depending on an interface scheme between the host device 3100 and the memory system 3200. The connection terminal 3250 may be disposed on a side of the memory system 3200, as shown.

Figure 8:
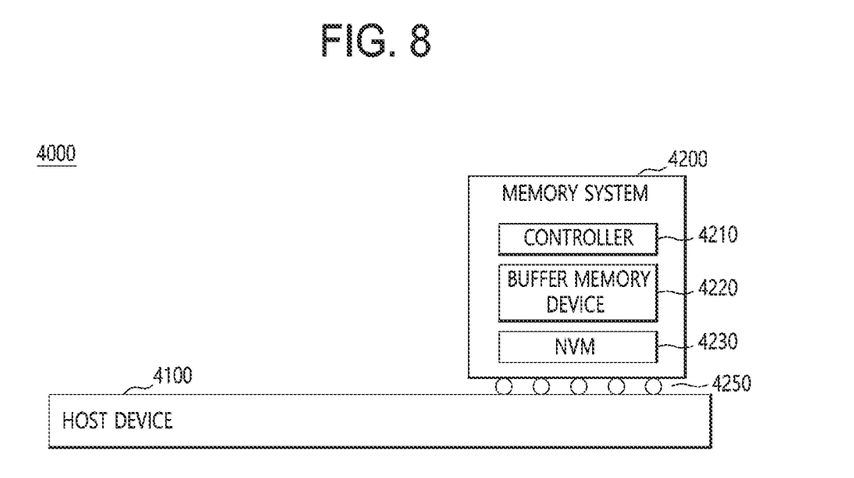

FIG. 8 is a diagram illustrating a data processing system 4000 in accordance with an embodiment of the present disclosure. Referring to FIG. 8, the data processing system 4000 may include a host device 4100 and a memory system 4200.

The host device 4100 may be configured in the form of a board, such as a printed circuit board. Although not shown, the host device 4100 may include internal function blocks for performing the function of a host device.

The memory system 4200 may be configured in the form of a surface-mounted type package. The memory system 4200 may be mounted to the host device 4100 through solder balls 4250. The memory system 4200 may include a controller 4210, a buffer memory device 4220, and a nonvolatile memory device 4230.

The controller 4210 may control general operations of the memory system 4200. The controller 4210 may be configured in the same manner as a SoC such like the semiconductor integrated apparatus 10 shown in FIGS. 1 and 2.

The buffer memory device 4220 may temporarily store data to be stored in the nonvolatile memory device 4230. Further, the buffer memory device 4220 may temporarily store data read from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as the storage medium of the memory system 4200.

Figure 9:
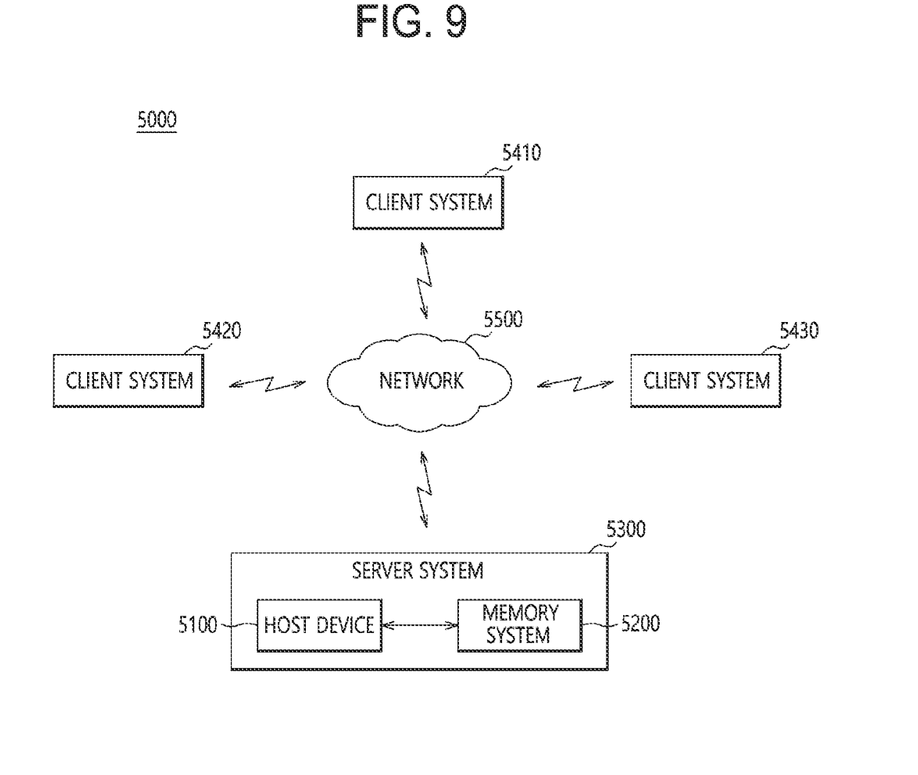
FIG. 9 is a diagram illustrating a network system including a data storage device in accordance with an embodiment of the present disclosure.

FIG. 9 is a diagram illustrating a network system 5000 including a data storage device, in accordance with an embodiment of the present disclosure. Referring to FIG. 9, the network system 5000 may include a server system 5300 and a plurality of client systems 5410, 5420, and 5430, which are coupled through a network 5500.

The server system 5300 may service data in response to requests from the plurality of client systems 5410 to 5430. For example, the server system 5300 may store the data provided by the plurality of client systems 5410 to 5430. For another example, the server system 5300 may provide data to the plurality of client systems 5410 to 5430.

The server system 5300 may include a host device 5100 and a memory system 5200. The memory system 5200 may be configured as the data processing apparatus 30 shown in FIG. 3, the data storage device 1200 shown in FIG. 6, the memory system 3200 shown in FIG. 7, or the memory system 4200 shown in FIG. 8.

While various embodiments have been described above, it will be understood by those skilled in the art that the embodiments described are examples only. Accordingly, the semiconductor integrated apparatus, the operating method thereof and the data processing apparatus including the same described herein should not be limited based on the described embodiments. It will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A semiconductor integrated apparatus comprising:
a plurality of functional blocks configured by electronic devices, respectively; and
a processor configured to:
control the plurality of functional blocks,
select voltage trim values of the respective functional blocks among a plurality of candidate voltage trim values, based on a detected level of input power supplied during a power-on operation, and
provide the voltage trim values to the plurality of functional blocks, respectively.

2. The semiconductor integrated apparatus according to claim 1, wherein the processor comprises:
a trim value memory circuit configured to store the plurality of candidate voltage trim values for each of the functional blocks, the plurality of candidate voltage trim values being classified according to a level of the input power; and
a trimming controller configured to:
select the voltage trim values from the plurality of candidate voltage trim values by referring to the trim value memory circuit according to a result of detecting the level of the input power, and
provide the selected voltage trim values to the plurality of functional blocks, respectively, for the function blocks to trim respective voltage characteristic information.

3. The semiconductor integrated apparatus according to claim 2, wherein the trim value memory circuit includes e-fuses that are programmed according to the voltage trim values.

4. The semiconductor integrated apparatus according to claim 1, wherein the plurality of functional blocks and the processor are integrated into one chip.

5. The semiconductor integrated apparatus according to claim 1, wherein at least one of the plurality of functional blocks is a host interface.

6. The semiconductor integrated apparatus according to claim 1, wherein at least one of the plurality of functional blocks is a storage interface.

7. A method for operating a semiconductor integrated apparatus comprising:
providing the semiconductor integrated apparatus including a plurality of functional blocks which are configured by electronic devices and a processor which controls the plurality of functional blocks;
storing, by the processor, a plurality of candidate voltage trim values to a trim value memory circuit;
detecting, by the processor, an input power level during a power-on operation of the semiconductor integrated apparatus;
selecting, by the processor, voltage trim values of the respective functional blocks among the plurality of candidate voltage trim values, corresponding to the detected input power level; and
providing, by the processor, the selected voltage trim values to the plurality of functional blocks, respectively.

8. The method according to claim 7, wherein the selecting of the voltage trim values comprises:
selecting the voltage trim values from the plurality of candidate voltage trim values for each of the functional blocks according to the detected input power level, the plurality of candidate voltage trim values being classified according to a level of the input power, by referring the plurality of candidate voltage trim values; and
providing the selected voltage trim values to the plurality of functional blocks, respectively, for the function blocks to trim respective voltage characteristic information.

9. The method according to claim 7, wherein the storing of the plurality of candidate voltage trim values comprises:
programming e-fuses included in the trim value memory circuit according to the plurality of candidate voltage trim values.

10. The method according to claim 7, wherein the providing of the semiconductor integrated apparatus comprises:
providing the plurality of functional blocks and the processor are integrated into one chip.

11. The method according to claim 7, wherein the providing of the semiconductor integrated apparatus comprises:
providing at least one of the plurality of functional blocks including a host interface.

12. The method according to claim 7, wherein the providing of the semiconductor integrated apparatus comprises:
providing at least one of the plurality of functional blocks including a storage interface.

13. A data processing apparatus comprising:
a storage configured to store data; and
a controller configured to transmit and receive data by controlling the storage in response to a request of a host apparatus,
wherein the controller comprises:
a plurality of functional blocks; and
a processor configured to:
control the plurality of functional blocks,
select voltage trim values of the respective functional blocks among a plurality of candidate voltage trim values, based on a detected level of input power supplied during a power-on operation, and
provide the selected voltage trim values to the plurality of functional blocks, respectively.

14. The data processing apparatus according to claim 13, wherein the processor comprises:
a trim value memory circuit configured to store the plurality of candidate voltage trim values for each of the functional blocks, the plurality of candidate voltage trim values being classified according to a level of the input power; and
a trimming controller configured to:
select voltage trim values from the plurality of candidate voltage trim values by referring to the trim value memory circuit according to a result of detecting the level of the input power, and
provide the selected voltage trim values to the plurality of functional blocks, respectively, for the function blocks to trim respective voltage characteristic information.

15. The data processing apparatus according to claim 14, wherein the trim value memory circuit includes e-fuses that are programmed according to the voltage trim values.

16. The data processing apparatus according to claim 13, wherein the plurality of functional blocks and the processor are integrated into one chip.

17. The data processing apparatus according to claim 13, wherein at least one of the plurality of functional blocks is a host interface.

18. The data processing apparatus according to claim 13, wherein at least one of the plurality of functional blocks is a storage interface.

19. An integrated circuit comprising:
an operation circuit operable according to voltage characteristic information; and a control circuit configured to provide the operation circuit with a piece of trim information selected from pre-stored pieces of candidate trim information according to an input voltage, wherein the operation circuit is configured to trim, for its normal operation, the voltage characteristic information according to the provided piece of trim information.

\* \* \* \* \*